(12) United States Patent
Redaelli et al.

(10) Patent No.: US 10,290,456 B2
(45) Date of Patent: May 14, 2019

(54) METHODS OF FORMING AND USING FUSES

(71) Applicant: Micron Technology, Inc., Boise, ID (US)

(72) Inventors: Andrea Redaelli, Casatenovo (IT); Giorgio Servalli, Fara Gera D'Adda (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/339,699

(22) Filed: Oct. 31, 2016

(65) Prior Publication Data

US 2017/0047187 A1 Feb. 16, 2017

Related U.S. Application Data

(62) Division of application No. 14/629,296, filed on Feb. 23, 2015, now Pat. No. 9,514,905, which is a division
(Continued)

(51) Int. Cl.
*H01H 85/06* (2006.01)
*H01H 85/08* (2006.01)
(Continued)

(52) U.S. Cl.
CPC ......... *H01H 85/06* (2013.01); *G11C 13/0004* (2013.01); *H01H 37/32* (2013.01);
(Continued)

(58) Field of Classification Search
CPC ........ H01H 85/11; H01H 37/32; H01H 85/08; H01H 85/06; Y10T 29/49107; G11C 13/0004
(Continued)

(56) References Cited

U.S. PATENT DOCUMENTS

| 4,080,719 A | 3/1978 | Wilting |
| 4,166,279 A * | 8/1979 | Gangulee ............... H01B 5/14 |
| | | 252/512 |

(Continued)

FOREIGN PATENT DOCUMENTS

| EP | 12850697.9 | 6/2015 |
| EP | 14749460 | 7/2016 |

(Continued)

OTHER PUBLICATIONS

U.S. Appl. No. 13/276,523, filed Oct. 19, 2011, Redaelli et al.
(Continued)

*Primary Examiner* — Anatoly Vortman
(74) *Attorney, Agent, or Firm* — Wells St. John P.S.

(57) ABSTRACT

Some embodiments include a fuse having a tungsten-containing structure directly contacting an electrically conductive structure. The electrically conductive structure may be a titanium-containing structure. An interface between the tungsten-containing structure and the electrically conductive structure is configured to rupture when current through the interface exceeds a predetermined level. Some embodiments include a method of forming and using a fuse. The fuse is formed to have a tungsten-containing structure directly contacting an electrically conductive structure. An interface between the tungsten-containing structure and the electrically conductive structure is configured to rupture when current through the interface exceeds a predetermined level. Current exceeding the predetermined level is passed through the interface to rupture the interface.

8 Claims, 3 Drawing Sheets

Related U.S. Application Data of application No. 13/276,523, filed on Oct. 19, 2011, now Pat. No. 8,994,489.

(51) Int. Cl.
*G11C 13/00* (2006.01)
*H01H 85/11* (2006.01)
*H01H 37/32* (2006.01)

(52) U.S. Cl.
CPC ............ *H01H 85/08* (2013.01); *H01H 85/11* (2013.01); *Y10T 29/49107* (2015.01)

(58) Field of Classification Search
USPC ........................................ 337/290, 295, 296
See application file for complete search history.

(56) References Cited

U.S. PATENT DOCUMENTS

| | | |
|---|---|---|
| 4,499,557 A | 2/1985 | Holmberg |
| 4,536,948 A * | 8/1985 | Te Velde ................ G11C 17/12 |
| | | 148/DIG. 55 |
| 4,752,118 A | 6/1988 | Johnson |
| 4,849,247 A | 7/1989 | Scanlon et al. |
| 4,987,099 A | 1/1991 | Flanner |
| 5,055,423 A | 10/1991 | Smith et al. |
| 5,166,758 A | 11/1992 | Ovshinsky et al. |
| 5,168,332 A | 12/1992 | Kunishima et al. |
| 5,341,328 A | 8/1994 | Ovshinsky et al. |
| 5,789,795 A * | 8/1998 | Sanchez .............. H01L 23/5252 |
| | | 257/530 |
| 5,895,963 A | 4/1999 | Yamazaki |
| 5,912,839 A | 6/1999 | Ovshinsky et al. |
| 6,124,194 A * | 9/2000 | Shao .................. H01L 21/7681 |
| | | 257/529 |
| 6,143,670 A | 11/2000 | Cheng et al. |
| 6,251,710 B1 * | 6/2001 | Radens ............... H01L 23/5252 |
| | | 257/E23.147 |
| 6,555,458 B1 * | 4/2003 | Yu ...................... H01L 23/5256 |
| | | 257/E23.149 |
| 6,579,760 B1 | 6/2003 | Lung |
| 6,611,453 B2 | 8/2003 | Ning |
| 6,613,604 B2 | 9/2003 | Maimon et al. |
| 6,661,330 B1 | 12/2003 | Young |
| 6,664,182 B2 | 12/2003 | Jeng |
| 6,692,898 B2 | 2/2004 | Ning |
| 6,700,211 B2 | 3/2004 | Gonzalez |
| 6,764,894 B2 | 7/2004 | Lowrey |
| 6,815,704 B1 | 11/2004 | Chen |
| 6,906,940 B1 | 6/2005 | Lue |
| 7,148,140 B2 | 12/2006 | Leavy et al. |
| 7,169,624 B2 | 1/2007 | Hsu |
| 7,332,401 B2 | 2/2008 | Moore et al. |
| 7,422,926 B2 | 9/2008 | Pellizzer et al. |
| 7,453,111 B2 | 11/2008 | Ryoo et al. |
| 7,592,206 B2 * | 9/2009 | Kang .................. H01L 23/5258 |
| | | 257/530 |
| 7,619,933 B2 | 11/2009 | Sarin |
| 7,638,787 B2 | 12/2009 | An et al. |
| 7,646,631 B2 | 1/2010 | Lung |
| 7,719,039 B2 | 5/2010 | Muralidhar et al. |
| 7,772,680 B2 | 8/2010 | Manning |
| 7,773,413 B2 | 8/2010 | Shalvi |
| 7,785,978 B2 | 8/2010 | Smythe |
| 7,800,092 B2 | 9/2010 | Liu et al. |
| 7,803,655 B2 | 9/2010 | Johnson et al. |
| 7,838,341 B2 | 11/2010 | Dennison |
| 7,867,832 B2 | 1/2011 | Yang et al. |
| 7,888,711 B2 | 2/2011 | Cheung et al. |
| 7,915,602 B2 | 3/2011 | Sato |
| 7,919,766 B2 | 4/2011 | Lung |
| 7,935,553 B2 | 5/2011 | Scheuerlein et al. |
| 7,974,115 B2 | 7/2011 | Jeong et al. |
| 8,013,319 B2 | 9/2011 | Chang |
| 8,022,382 B2 * | 9/2011 | Lai ........................ H01L 45/06 |
| | | 257/3 |
| 8,110,822 B2 | 2/2012 | Chen |
| 8,486,743 B2 | 7/2013 | Bresolin et al. |
| 8,507,353 B2 | 8/2013 | Oh et al. |
| 8,546,231 B2 | 10/2013 | Pellizzer et al. |
| 8,614,433 B2 | 12/2013 | Lee et al. |
| 8,723,155 B2 | 5/2014 | Redaelli et al. |
| 8,765,555 B2 | 7/2014 | Van Gerpen |
| 8,822,969 B2 | 9/2014 | Hwang |
| 9,299,930 B2 | 3/2016 | Redaelli et al. |
| 9,673,393 B2 | 6/2017 | Pellizzer |
| 2002/0017701 A1 | 2/2002 | Klersy et al. |
| 2002/0173101 A1 | 11/2002 | Shau |
| 2002/0177292 A1 | 11/2002 | Dennison |
| 2004/0178425 A1 | 9/2004 | Kato |
| 2004/0188668 A1 | 9/2004 | Hamann et al. |
| 2004/0195604 A1 | 10/2004 | Hwang et al. |
| 2005/0001212 A1 * | 1/2005 | Matsui .............. H01L 21/02175 |
| | | 257/52 |
| 2005/0006681 A1 | 1/2005 | Okuno |
| 2005/0110983 A1 | 5/2005 | Jeong et al. |
| 2005/0117397 A1 | 6/2005 | Morimoto |
| 2005/0162881 A1 | 7/2005 | Stasiak |
| 2005/0243596 A1 * | 11/2005 | Symanczyk .......... H01L 45/085 |
| | | 365/153 |
| 2006/0073631 A1 | 4/2006 | Karpov et al. |
| 2006/0073652 A1 | 4/2006 | Pellizzer et al. |
| 2006/0076548 A1 | 4/2006 | Park et al. |
| 2006/0110888 A1 | 5/2006 | Cho et al. |
| 2006/0113520 A1 | 6/2006 | Yamamoto et al. |
| 2006/0157679 A1 | 7/2006 | Scheuerlein |
| 2006/0157682 A1 | 7/2006 | Scheuerlein |
| 2006/0186440 A1 | 8/2006 | Wang et al. |
| 2006/0226409 A1 | 10/2006 | Burr |
| 2006/0284279 A1 | 12/2006 | Lung et al. |
| 2006/0286709 A1 | 12/2006 | Lung et al. |
| 2007/0008773 A1 | 1/2007 | Scheuerlein |
| 2007/0012905 A1 | 1/2007 | Huang |
| 2007/0029676 A1 | 2/2007 | Takaura et al. |
| 2007/0054486 A1 | 3/2007 | Yang |
| 2007/0075347 A1 | 4/2007 | Lai et al. |
| 2007/0075359 A1 | 4/2007 | Yoon et al. |
| 2007/0108431 A1 | 5/2007 | Chen et al. |
| 2007/0158698 A1 | 7/2007 | Dennison et al. |
| 2007/0224726 A1 | 9/2007 | Chen et al. |
| 2007/0235708 A1 | 10/2007 | Elmgreen et al. |
| 2007/0272913 A1 | 11/2007 | Scheuerlein |
| 2007/0279974 A1 | 12/2007 | Dennison et al. |
| 2007/0285969 A1 | 12/2007 | Toda et al. |
| 2008/0014733 A1 | 1/2008 | Liu |
| 2008/0017842 A1 | 1/2008 | Happ et al. |
| 2008/0043520 A1 | 2/2008 | Chen |
| 2008/0054470 A1 | 3/2008 | Amano et al. |
| 2008/0064200 A1 | 3/2008 | Johnson et al. |
| 2008/0067485 A1 | 3/2008 | Besana et al. |
| 2008/0067486 A1 | 3/2008 | Karpov et al. |
| 2008/0093703 A1 | 4/2008 | Yang et al. |
| 2008/0101109 A1 | 5/2008 | Haring-Bolivar et al. |
| 2008/0105862 A1 | 5/2008 | Lung et al. |
| 2008/0123394 A1 | 5/2008 | Lee et al. |
| 2008/0128677 A1 | 6/2008 | Park et al. |
| 2008/0137400 A1 | 6/2008 | Chen et al. |
| 2008/0138929 A1 | 6/2008 | Lung |
| 2008/0157053 A1 | 7/2008 | Lai et al. |
| 2008/0197394 A1 | 8/2008 | Caspary et al. |
| 2009/0008621 A1 | 1/2009 | Lin et al. |
| 2009/0017577 A1 | 1/2009 | An et al. |
| 2009/0032794 A1 | 2/2009 | Hsiao |
| 2009/0039333 A1 | 2/2009 | Chang et al. |
| 2009/0072213 A1 | 3/2009 | Elmgreen et al. |
| 2009/0072341 A1 | 3/2009 | Liu et al. |
| 2009/0091971 A1 | 4/2009 | Dennison et al. |
| 2009/0101883 A1 | 4/2009 | Lai et al. |
| 2009/0108247 A1 | 4/2009 | Takaura et al. |
| 2009/0115020 A1 | 5/2009 | Yang et al. |
| 2009/0127538 A1 | 5/2009 | Ryoo et al. |
| 2009/0147564 A1 | 6/2009 | Lung |
| 2009/0166601 A1 | 7/2009 | Czubatyj et al. |

(56) References Cited

U.S. PATENT DOCUMENTS

| | | |
|---|---|---|
| 2009/0194757 A1 | 8/2009 | Lam et al. |
| 2009/0194758 A1 | 8/2009 | Chen |
| 2009/0230378 A1 | 9/2009 | Ryoo et al. |
| 2009/0230505 A1 | 9/2009 | Dennison |
| 2009/0298222 A1 | 12/2009 | Lowrey et al. |
| 2009/0302300 A1 | 12/2009 | Chang et al. |
| 2009/0321706 A1 | 12/2009 | Happ et al. |
| 2010/0001248 A1 | 1/2010 | Wouters et al. |
| 2010/0001253 A1 | 1/2010 | Arnold et al. |
| 2010/0019221 A1 | 1/2010 | Lung et al. |
| 2010/0054029 A1 | 3/2010 | Happ et al. |
| 2010/0055830 A1 | 3/2010 | Chen et al. |
| 2010/0065530 A1 | 3/2010 | Walker et al. |
| 2010/0065804 A1 | 3/2010 | Park |
| 2010/0072447 A1 | 3/2010 | Lung |
| 2010/0072453 A1 | 3/2010 | Jeong et al. |
| 2010/0107403 A1 | 5/2010 | Aubel et al. |
| 2010/0151652 A1 | 6/2010 | Lung et al. |
| 2010/0163830 A1 | 7/2010 | Chang et al. |
| 2010/0163833 A1 | 7/2010 | Borghi et al. |
| 2010/0165719 A1 | 7/2010 | Pellizzer |
| 2010/0171188 A1 | 7/2010 | Lung et al. |
| 2010/0176368 A1 | 7/2010 | Ko et al. |
| 2010/0176911 A1 | 7/2010 | Park et al. |
| 2010/0203672 A1 | 8/2010 | Eun et al. |
| 2010/0207168 A1 | 8/2010 | Sills et al. |
| 2010/0213431 A1 | 8/2010 | Yeh et al. |
| 2010/0221874 A1 | 9/2010 | Kuo et al. |
| 2010/0243980 A1 | 9/2010 | Fukumizu |
| 2010/0254175 A1 | 10/2010 | Scheuerlein |
| 2010/0270529 A1 | 10/2010 | Lung |
| 2010/0301303 A1 | 12/2010 | Wang et al. |
| 2010/0301304 A1 | 12/2010 | Chen et al. |
| 2010/0301417 A1 | 12/2010 | Cheng et al. |
| 2010/0308296 A1 | 12/2010 | Pirovano et al. |
| 2010/0323490 A1 | 12/2010 | Sreenivasan et al. |
| 2010/0327251 A1 | 12/2010 | Park |
| 2011/0001114 A1 | 1/2011 | Zanderighi et al. |
| 2011/0031461 A1 | 2/2011 | Kang et al. |
| 2011/0068318 A1 | 3/2011 | Ishibashi et al. |
| 2011/0074538 A1 | 3/2011 | Wu et al. |
| 2011/0092041 A1 | 4/2011 | Lai et al. |
| 2011/0155984 A1 | 6/2011 | Redaelli et al. |
| 2011/0155985 A1 | 6/2011 | Oh et al. |
| 2011/0193042 A1 | 8/2011 | Maxwell |
| 2011/0193049 A1 | 8/2011 | Iwakaji et al. |
| 2011/0215436 A1 | 9/2011 | Tang et al. |
| 2011/0284815 A1 | 11/2011 | Kim et al. |
| 2011/0300685 A1 | 12/2011 | Horii et al. |
| 2011/0312178 A1 | 12/2011 | Watanabe et al. |
| 2012/0091422 A1 | 4/2012 | Choi et al. |
| 2012/0126196 A1 | 5/2012 | Pio |
| 2012/0241705 A1 | 9/2012 | Bresolin et al. |
| 2012/0248504 A1 | 10/2012 | Liu |
| 2012/0256150 A1 | 10/2012 | Zagrebelny et al. |
| 2012/0256151 A1 | 10/2012 | Liu et al. |
| 2012/0273742 A1 | 11/2012 | Minemura |
| 2012/0305875 A1 | 12/2012 | Shim |
| 2012/0313067 A1 | 12/2012 | Lee |
| 2013/0099888 A1 | 4/2013 | Redaelli et al. |
| 2013/0126812 A1 | 5/2013 | Redaelli |
| 2013/0126816 A1 | 5/2013 | Tang et al. |
| 2013/0126822 A1 | 5/2013 | Pellizzer et al. |
| 2013/0277796 A1 | 10/2013 | Yang et al. |
| 2013/0285002 A1 | 10/2013 | Van Gerpen et al. |
| 2014/0117302 A1 | 5/2014 | Goswami |
| 2014/0217350 A1 | 5/2014 | Liu et al. |
| 2014/0206171 A1 | 7/2014 | Redaelli |
| 2015/0279906 A1 | 10/2015 | Lindenberg et al. |
| 2015/0349255 A1 | 12/2015 | Pellizzer et al. |
| 2015/0357380 A1 | 12/2015 | Pellizzer |

FOREIGN PATENT DOCUMENTS

| | | |
|---|---|---|
| WO | WO 2005/041196 | 5/2005 |
| WO | WO 2010/073904 | 7/2010 |
| WO | WO 2013/039496 | 3/2013 |
| WO | WO PCT/US2012/063962 | 3/2013 |
| WO | WO PCT/US2012/063962 | 5/2014 |
| WO | WO PCT/US2014/011250 | 5/2014 |
| WO | WO PCT/US2014/011250 | 8/2015 |

OTHER PUBLICATIONS

U.S. Appl. No. 13/298,722, filed Nov. 17, 2011, Redaelli et al.
U.S. Appl. No. 13/298,840, filed Nov. 17, 2011, Tang et al.
U.S. Appl. No. 13/298,962, filed Nov. 17, 2011, Pellizzer et al.
U.S. Appl. No. 13/460,302, filed Apr. 30, 2012, Van Gerpen et al.
U.S. Appl. No. 13/460,356, filed Apr. 30, 2012, Van Gerpen.
U.S. Appl. No. 13/666,744, filed Nov. 1, 2012, Goswami.
U.S. Appl. No. 13/761,570, filed Feb. 7, 2013, Liu et al.
U.S. Appl. No. 14/242,588, filed Apr. 1, 2014, Lindenberg.
U.S. Appl. No. 14/293,577, filed Jun. 2, 2014, Pellizzer et al.
U.S. Appl. No. 14/295,770, filed Jun. 4, 2014, Pellizzer.
Bez; Chalcogenide PCM: a Memory Technology for Next Decade; IEEE, 2009, pp. 5.1.1 .5.1.4.
Czubatyj et al., "Current Reduction in Ovonic Memory Devices", downloaded from www.epcos.org/library/papers/pdC2006/pdf . . . /Czubatyj.pdf; prior to Nov. 17, 2011.
Fazio, "Future Directions of Non-Volatile Memory in Compute Applications", IEEE, 2009, pp. 27.7.1-727,7.4.
Happ et al., "Novel One-Mask Self-Heating Pillar Phase Change Memory", IEEE, 2006 Symposium on 5 VLSI Technology Digest of Technical Papers; 2 pp.
Lee et al.; Programming Disturbance and Cell Scaling in Phase Change Memory: For up to 16nm based 4F2 Cell; IEEE, 2010 Symposium on VLSI Technology Digest ofTechnical Papers, pp. 199-200.
Raoux et al., Effect of Ion Implantation on Crystallization Properties of Phase Change Materials, presented at E\PCOS201 0 Conference, Sep. 6-7, 2010, Politecnico di Milano, Milan, Italy.
Russo et al.; Modeling of Programming and Read Performance in Phase-Change Memories—Part II: Program Disturb and Mixed-Scaling Approach,. IEEE Transactions on Electron Devices, vol. 55(2), Feb. 2008, pp. 5.15-5.22.
Servalli; A 45nm Generation Phase Change Memory Technology; IEEE 2009; pp. IEDM09-113-116.
Villa et al.; A 45nm 1Gb 1.8V Phase-Change Memory; 2010 IEEE International Solid-State Circuits Conference; Feb. 9, 2010; pp. 270-271.

* cited by examiner

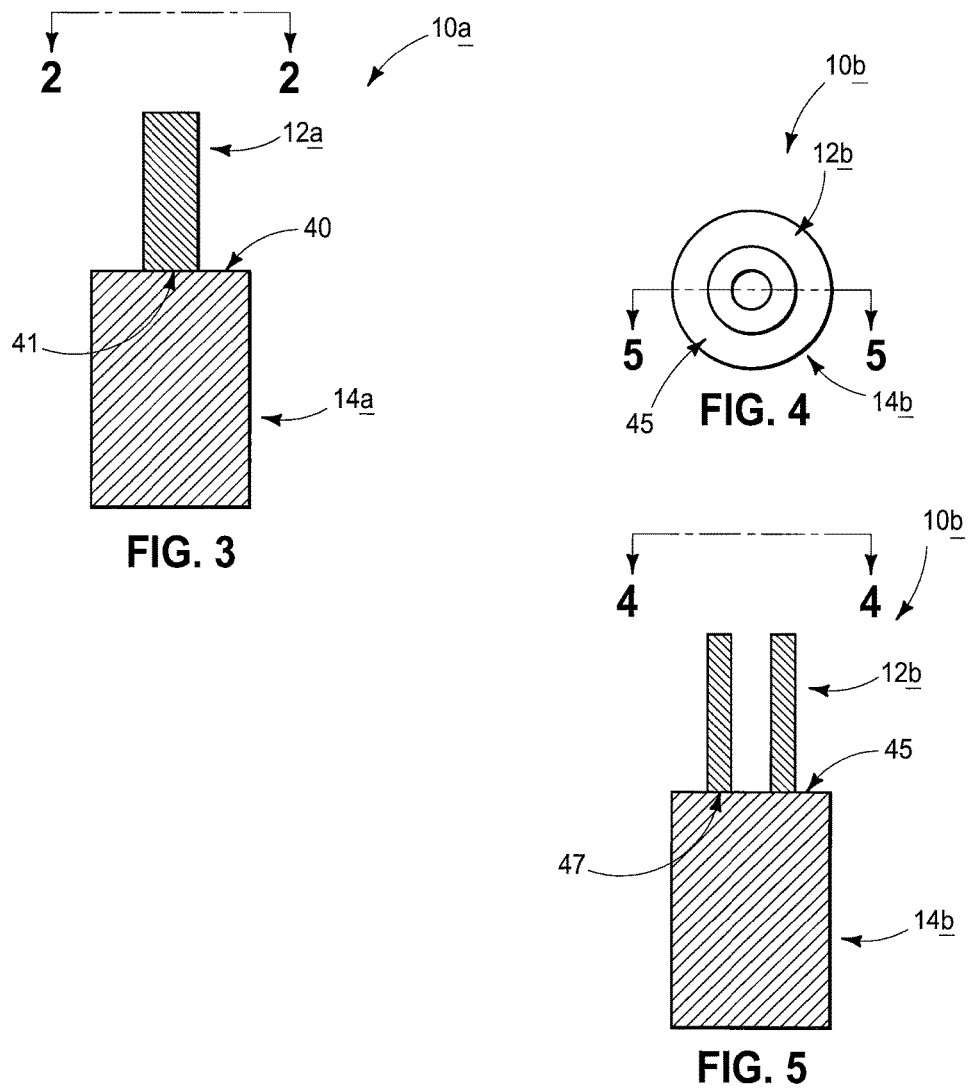

METHODS OF FORMING AND USING FUSES

RELATED PATENT DATA

This patent resulted from a divisional of U.S. patent application Ser. No. 14/629,296, which was filed Feb. 23, 2015, which issued as U.S. Pat. No. 9,514,905 and which is hereby incorporated herein by reference; which resulted from a divisional of U.S. patent application Ser. No. 13/276,523, which was filed Oct. 19, 2011, which issued as U.S. Pat. No. 8,994,489, and which is hereby incorporated herein by reference.

TECHNICAL FIELD

Fuses, and methods of forming and using fuses.

BACKGROUND

Some types of integrated circuitry utilize fuses. A fuse is a structure which can be broken down or blown in response to a predetermined current flow to interrupt a circuit.

A continuing goal of integrated circuit fabrication is to reduce process steps. Thus, it would be desirable to develop integrated circuit fuses which can be readily incorporated into existing fabrication processes without introduction of numerous new steps and materials. Some integrated circuit constructions may comprise memory arrays, such as arrays of phase change random access memory (PCRAM). It would be desirable to develop fuse architectures which can be readily incorporated into existing fabrication process utilized for producing PCRAM.

BRIEF DESCRIPTION OF THE DRAWINGS

FIGS. 2 and 3 are a top view and a diagrammatic cross-sectional view of an example embodiment fuse. FIG. 3 is along the line 3-3 of FIG. 2, and FIG. 2 is from the orientation shown along the line 2-2 in FIG. 3.

FIGS. 4 and 5 are a top view and a diagrammatic cross-sectional view of an example embodiment fuse. FIG. 5 is along the line 5-5 of FIG. 4, and FIG. 4 is from the orientation shown along the line 4-4 in FIG. 5.

FIG. 7 is along the lines 7-7 of FIGS. 6 and 8, FIG. 8 is along the lines 8-8 of FIGS. 6 and 7, and FIG. 6 is from the orientation shown along the lines 6-6 in FIGS. 7 and 8.

DETAILED DESCRIPTION OF THE ILLUSTRATED EMBODIMENTS

In some embodiments, the invention includes fuses formed by providing an electrically conductive structure directly against a tungsten-containing structure. In some embodiments, the electrically conductive structure may be a titanium-containing structure. An interface where the electrically conductive structure joins the tungsten-containing structure is configured to rupture when current through such interface exceeds a predetermined level.

Some embodiments include fuses that may be readily incorporated into existing integrated circuit fabrication. The fuses utilize materials which are already commonly utilized in integrated circuits. For instance, the fuses having titanium-containing structures and tungsten-containing structures may be readily incorporated into existing PCRAM fabrication processes. Specifically, PCRAM already commonly utilizes titanium-containing structures as heaters within memory cells, and already commonly utilizes tungsten-containing structures as conductive interconnects between circuit components.

Example embodiments are described with reference to FIGS. 1-9.

Figure 1:
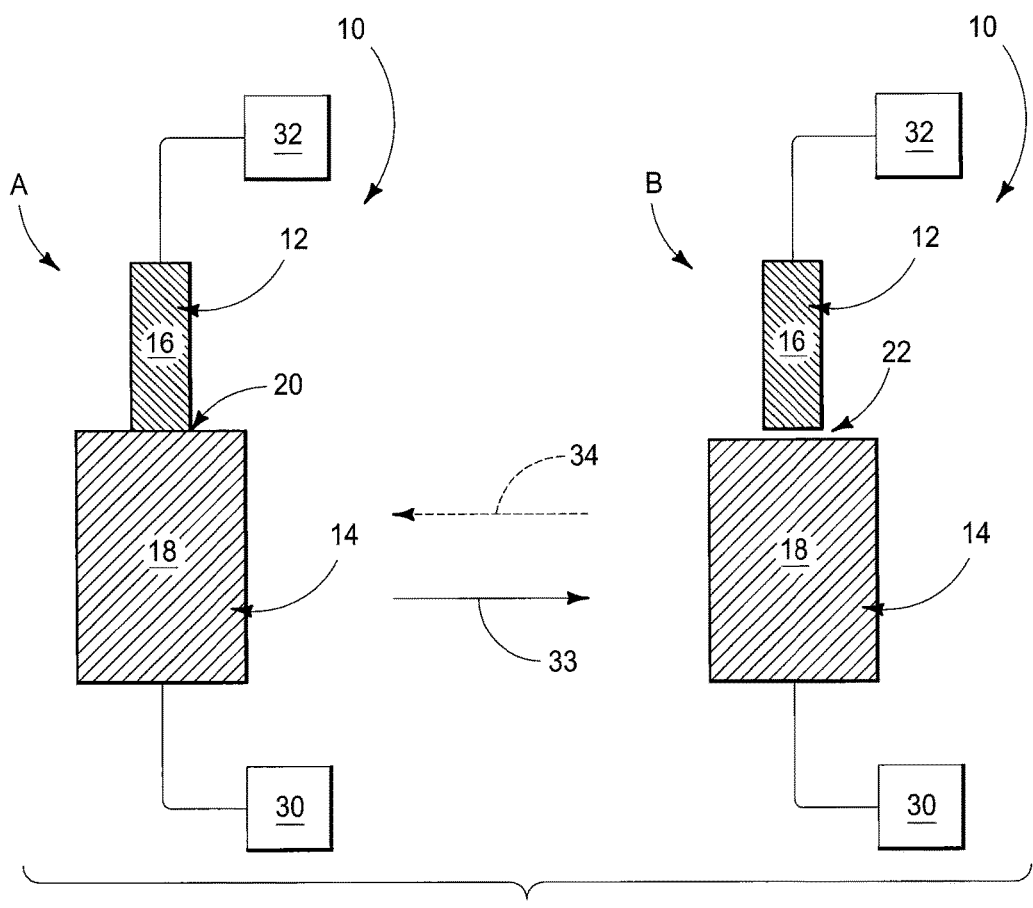
FIG. 1 diagrammatically illustrates an example embodiment fuse (in diagrammatic cross-sectional view) at two different operational states.

Referring to FIG. 1, a fuse construction 10 is shown in two different operational modes "A" and "B."

The fuse construction comprises an electrically conductive structure 12 over a tungsten-containing structure 14.

The electrically conductive structure 12 may comprise any suitable electrically conductive composition, and in some embodiments may be a titanium-containing structure. The structure 12 comprises a material 16. Such material may be of any suitable composition; and in some embodiments may comprise, consist essentially of, or consist of a mixture of titanium and nitrogen. For instance, the material 16 may comprise, consist essentially of, or consist of titanium nitride; either alone, or in combination with one or more dopants selected from the group consisting of aluminum, silicon and carbon.

The tungsten-containing structure 14 comprises a material 18. Such material may be of any suitable composition; and in some embodiments may comprise, consist essentially of, or consist of tungsten. The tungsten-containing structure may be over a semiconductor base (not shown). Such semiconductor base may comprise silicon, and the tungsten-containing structure may join to the silicon through a tungsten silicide interface (not shown).

If the tungsten-containing structure 14 is over a semiconductor base, the construction 10 may be considered to be comprised by a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The operational mode "A" has the electrically conductive structure 12 directly against the tungsten-containing structure 14. The structure 12 joins to the tungsten-containing structure 14 at an interface 20. Such interface is configured to rupture when current through the interface exceeds a predetermined level. The amount of current suitable to generate such rupture may depend on, among other things, the composition of tungsten-containing structure 14 along the interface, the composition of structure 12 along the interface, and the area of the interface. Thus, the fuse may be tailored for particular applications by adjusting one or more of the composition of structure 12, the composition of tungsten-containing structure 14, and the area of interface 20.

The amount of current suitable to generate the rupture may also depend on the voltage provided across interface 20, but such voltage may be relatively fixed by operational characteristics of an integrated circuit. Accordingly, the voltage may not be an operational parameter which can be readily modified for tailoring operational performance of the fuse.

The amount of current suitable to rupture the interface will be inversely related to the area of the interface. In some embodiments, it will be desired to have the fuse be readily broken with a current less of than or equal to about 3 milliamps. In such embodiments, the total area of the interface 20 may be less than or equal to about 1500 square nanometers (i.e., $nm^2$), which can enable the fuse to be broken with a current of less than or equal to about $2.5 \times 10^{-3}$ amps under a voltage of less than or equal to about 2 volts. Thus, in some embodiments the predetermined current which ruptures the interface may be less than or equal to about 3 milliamps, and may be, for example, about 2.5 milliamps.

In some embodiments, the electrically conductive structure 12 may comprise titanium nitride doped with one or more of silicon, aluminum and carbon. The amount of current suitable to rupture the interface may be related to the type of dopant and the amount of dopant. Thus, operational characteristics of fuse construction 10 may be tailored, to some extent, through the selection of dopant concentration and type provided within the titanium nitride.

The fuse construction 10 is transitioned from the operational mode "A" to the operational mode "B" by providing sufficient current through interface 20 to rupture such interface and thus form the void 22 shown in the operational mode "B."

The fuse construction 10 is diagrammatically illustrated to be provided between circuitry 30 and circuitry 32. The operational mode "A" may be considered to comprise a closed circuit through fuse construction 10 so that the circuitry 30 is electrically connected to the circuitry 32 through the fuse construction, and the operational mode "B" may be considered to comprise an open circuit through the fuse construction so that the circuitry 30 is no longer connected to the circuitry 32.

In some embodiments, the rupture of the interface 20 of the fuse occurs through a mechanism utilizing electron wind. Specifically, current flow through the interface causes electro-migration wherein momentum of moving electrons causes atoms to move from their original positions, and ultimately causes formation of the void 22. The mechanism is provided herein to assist the reader in understanding the invention, and is not to limit the invention except to the extent, if any, that such mechanism is expressly recited in the claims that follow.

The transition from operational mode "A" to operational mode "B" is diagrammatically illustrated with an arrow 33. Another arrow 34 is shown in dashed-line to indicate that there may be a transition from operational mode "B" back to operational mode "A," which may be utilized to reset the fuse in some embodiments. Specifically, if sufficient voltage is provided across the void 22 in operational mode "B," and if such voltage is provided in an appropriate orientation so that current may be flowed across the void in an opposite direction (i.e., an opposite polarity) to the current flow that created the void, then it may be possible to recover the interface 20 of operational mode "A." In the embodiment discussed above in which the total area of the interface 20 was less than or equal to about 1500 $nm^2$, the interface could be recovered with a voltage exceeding about 6 volts.

A difficulty in recovering the interfaces of fuse constructions of the type shown in FIG. 1 is that there may be a substantial variability between seemingly identical fuses relative to the amount of voltage required to accomplish such recovery. Another difficulty is that there may be substantial differences between the recovered fuses relative to the current flow across the reestablished interfaces. Regardless of the above-described difficulties, there may be embodiments in which it is advantageous to recover at least some of the fuses utilized in an integrated circuit.

The fuse construction 10 of FIG. 1 may have any suitable configuration. Example configurations are described with reference to FIGS. 3-8.

Referring to FIG. 3, an example configuration 10a is shown in top view (FIG. 2) and cross-sectional side view (FIG. 3). The construction comprises an electrically conductive structure 12a (which may be a titanium-containing structure) configured as a substantially cylindrical pedestal, and comprises a tungsten-containing structure 14a which is also configured to be substantially cylindrical. The tungsten-containing structure 14a has a substantially circular end 40, and the pedestal 12a has an edge 41 which is directly against such end. In the shown embodiment, the edge 41 is a substantially circular end of the pedestal 12a.

In the shown embodiment of FIGS. 2 and 3, the end 40 of the tungsten-containing structure 14a is larger than the end 41 of the structure 12a. In other words, the end 40 has a first total area (i.e., a first surface area), and the end 41 has a second total area (i.e., a second surface area); with the second total area being less than the first total area.

Referring to FIGS. 4 and 5, an example configuration 10b is shown in top view (FIG. 4) and cross-sectional side view (FIG. 5). The construction comprises an electrically conductive structure 12b (which may be a titanium-containing structure) configured as a substantially cylindrical annular structure, and comprises a substantially cylindrical tungsten-containing structure 14b. The tungsten-containing structure 14a has a substantially circular end 45, and the pedestal 12b has an annular edge 47 which is directly against such end. In the shown embodiment, the edge 47 is a substantially circular end of the annular structure 12b.

Figure 6:
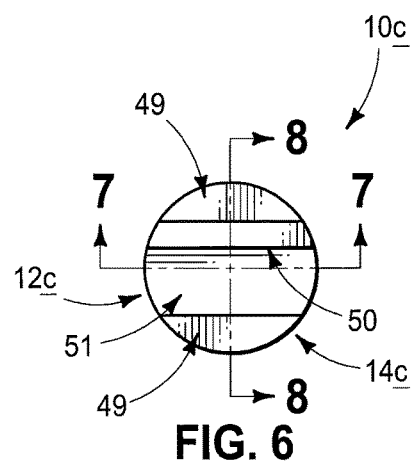
FIGS. 6-8 are a top view and a pair of diagrammatic cross-sectional views of an example embodiment fuse.
Figure 7:
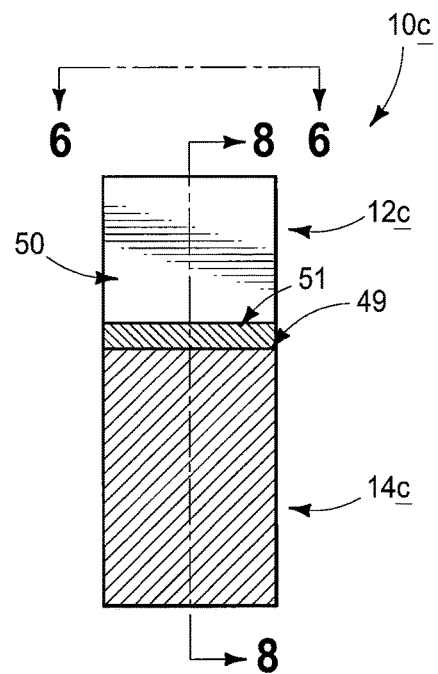
Figure 8:
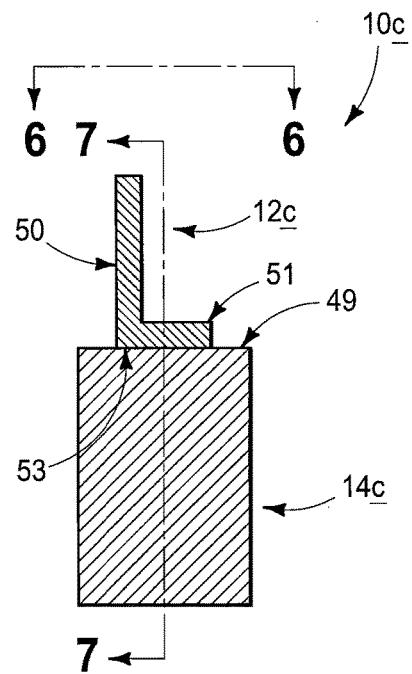

Referring to FIGS. 6-8, an example configuration 10c is shown in top view (FIG. 6) and in a pair of cross-sectional side views (FIGS. 7 and 8). The construction comprises a substantially cylindrical tungsten-containing structure 14c having a substantially circular end 49. The construction 10c also comprises an electrically conductive structure 12c (which may be a titanium-containing structure) configured to comprise a plate 50 oriented to have an edge 53 directly against the end 49 of the tungsten-containing structure 14c; and to have a ledge 51 along the plate 50 and also along the end 49 of the tungsten-containing structure 14c.

Figure 9:
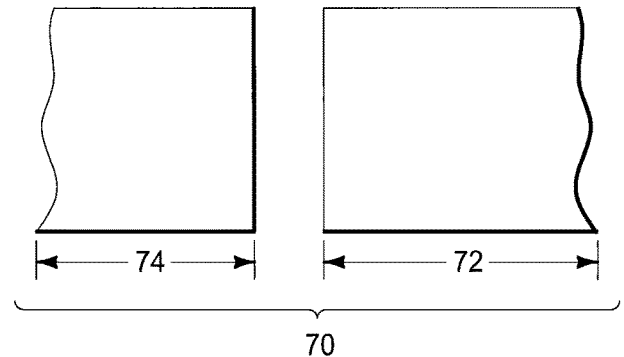
FIG. 9 diagrammatically illustrates a plan view of a semiconductor construction comprising a fuse region and a memory array region.

As discussed above, an advantage of the fuse constructions described herein may be that such fuse constructions can be readily incorporated into existing integrated circuit fabrication processes. FIG. 9 illustrates an example integrated circuit 70 which may be configured to utilize fuses of the types described above with reference to FIGS. 1-8. The circuit 70 comprises a memory array region 72 and a fuse region 74 (which may be referred to as a fuse bank). The memory array region may be configured to comprise any of numerous types of memory constructions, either now known or yet to be developed. In some embodiments, the memory array region may comprise PCRAM. Such memory may utilize titanium nitride-containing structures as heaters of individual memory cells, and may utilize tungsten-containing structures as electrical interconnects, in accordance with conventional processing.

The utilization of one or more constructions of the types described above with reference to FIGS. 1-8 may enable one or more components of such fuses to be formed simultaneously with one or more components of the memory. For instance, tungsten-containing structures of the fuses may be formed simultaneously with electrical interconnects of the memory and/or titanium-containing structures of the fuses may be formed simultaneously with heater structures of PCRAM cells. Such may advantageously enable fuses to be incorporated into existing integrated circuitry without addition of materials or masking steps beyond those already utilized in fabrication of the integrated circuitry. Although it may be advantageous for the fuses to be patterned utilizing a common mask as that utilized for forming a memory array in some embodiments, in other embodiments it may be preferred to utilize at least one dedicated mask during fabrication of the fuses (for instance, if it is desired to implant dopant into the fuses which is not utilized in the memory).

Although the embodiment of FIG. 9 refers to the integrated circuitry 72 as being memory, in other embodiments other types of integrated circuitry may be utilized in combination with one or more of the fuse types described above with reference to FIGS. 1-8.

The fuses discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a fuse comprising a tungsten-containing structure and an electrically conductive structure directly contacting the tungsten-containing structure. An interface between the tungsten-containing structure and the electrically conductive structure is configured to rupture when current through said interface exceeds a predetermined level.

Some embodiments include a fuse comprising a tungsten-containing structure having a first end with a first total area, and an electrically conductive structure having a second end with a second total area. The second total area is less than the first total area. An entirety of the second end directly contacts the first end. An interface between the first and second ends is configured to rupture when current through said interface exceeds a predetermined level. The electrically conductive structure may be a titanium-containing structure comprising a mixture containing titanium and nitrogen. The interface comprises an area of less than or equal to about 1500 nm$^2$.

Some embodiments include a method of forming and using a fuse. A fuse is formed to comprise a tungsten-containing structure directly contacting a titanium-containing structure. An interface between the tungsten-containing structure and the titanium-containing structure is configured to rupture when current through said interface exceeds a predetermined level. Current exceeding the predetermined level is passed through the interface to rupture the interface.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of using a fuse, comprising:
providing the fuse to comprise a tungsten-containing structure directly contacting a titanium-containing structure; the tungsten containing structure having a circular uppermost surface with a total area and contacting the titanium-containing structure only at an interface between the uppermost surface of the tungsten-containing and the titanium-containing structure, the interface being circular and having a total area of less than or equal to 1500 nm$^2$, the interface having an area that is less than the total area of the uppermost surface, the interface being configured to rupture when current through said interface exceeds a predetermined level;
passing current exceeding the predetermined level through the interface to rupture the interface;
wherein the fuse is formed adjacent a PCRAM array;
wherein at least one of the tungsten-containing structure and the titanium-containing structure is identical in composition with a structure of the PCRAM array; and
wherein the titanium-containing structure comprises titanium nitride doped with one or more of aluminum, silicon and carbon.

2. The method of claim 1 wherein at least one of the tungsten-containing structure and the titanium-containing structure is formed simultaneously with a structure of the PCRAM array.

3. The method of claim 2 wherein the tungsten-containing structure is formed simultaneously with a tungsten-containing structure of the PCRAM array.

4. The method of claim 2 wherein the titanium-containing structure is formed simultaneously with titanium-containing heater structures of PCRAM cells of the PCRAM array.

5. The method of claim 1 further comprising, after rupturing the interface, resetting the fuse by flowing current across the ruptured interface.

6. The method of claim 5 wherein the resetting comprises flowing current of an opposite polarity as compared to current utilized to rupture the interface.

7. The method of claim 1 wherein the rupture utilizes electron wind.

8. The method of claim 1 wherein the tungsten-containing structure consists of tungsten.

\* \* \* \* \*